United States Patent [19]
Crooke et al.

[11] 3,987,293
[45] Oct. 19, 1976

[54] PROGRAMMABLE GENERAL PURPOSE ANALOG FILTER

[75] Inventors: Arthur W. Crooke, Concord; Horst A. R. Wegener, Carlisle, both of Mass.

[73] Assignee: Sperry Rand Corporation, New York, N.Y.

[22] Filed: Aug. 4, 1975

[21] Appl. No.: 601,897

[52] U.S. Cl. .............................. 235/193; 307/221 D; 328/167
[51] Int. Cl.² ....................................... H03K 5/159
[58] Field of Search .......................... 235/193, 194; 307/221 D, 221 C, 221 R, 229; 328/167, 160; 333/70 T, 18, 28; 325/42

[56] References Cited
UNITED STATES PATENTS

| | | | |
|---|---|---|---|
| 3,533,606 | 1/1971 | Port | 333/70 T X |
| 3,699,321 | 10/1972 | Gibson | 333/18 X |
| 3,809,923 | 5/1974 | Esser | 333/70 T X |
| 3,819,953 | 6/1974 | Puckette et al. | 307/221 D |
| 3,866,209 | 2/1975 | Weimer | 307/221 D X |

Primary Examiner—Joseph F. Ruggiero
Attorney, Agent, or Firm—Howard P. Terry; Seymour Levine

[57] ABSTRACT

A programmable transversal filter employig two charge transfer delay lines one for sampling a reference function, the samples providing the weighting factors for the transversal filter; the other for sampling an input signal to the filter. Each sample of the input signal is then multiplied by the appropriate weighting factor obtained from the sampling of the reference signal and all products are summed to obtain a sample of the filter output.

9 Claims, 4 Drawing Figures

PROGRAMMABLE GENERAL PURPOSE ANALOG FILTER

BACKGROUND OF THE INVENTION

1. Field of the Invention

The present invention relates to the art of electrical filters and specifically to a sampled data filter, employing bucket brigade technology, the response of which may be varied with the alteration of a stored reference function.

2. Description of the Prior Art

Bucket brigade delay line (BBDL) technology which allows information storage in analog form offers the means by which the theory that has been developed for the design of digital filters can be utilized to design sampled data analog filters without the need for analog-to-digital conversion, thus combining the advantages of digital signal processing with the speed and simplicity of analog circuitry. These techniques have been employed in the prior art to design recursive and transversal type filters. The response characteristics, i.e., center frequency and bandwidth, of the recursive filters depend on the circuit parameters of gain and BBDL clock frequency, both of which may be electrically controlled thus providing a programmable filter. However, the recursive structure gives rise to spurious responses that limit the filter's frequency range of operation. Techniques to minimize the spurious responses require an appreciable increase in circuitry and gain parameters with a concomitant increase in complexity and cost.

Prior art transversal filters utilizing BBDL technology have been designed with fixed and programmable response characteristics. Fixed response designs establish desired weighting at each tap by means of a suitable choice of storage capacitance values whereas the programmable designs utilize amplifiers at each tap, the transconductance of which is electrically altered to provide the required weights to achieve the desired frequency response. Stop band performance characteristics of these filters is dependent upon the relative accuracy that can be achieved in the tap weight implementations, which is limited by the transconductance control ability of the amplifiers. Additionally, the filter characteristics that may be programmed are limited by the transconductance ranges of the amplifiers utilized.

The present invention provides a programmable transversal filter wherein the tap weights are supplied by a stored reference function, thereby eliminating the limitation on the range of filter characteristics that may be realized that are imposed by the achievable relative tap weight accuracies and transconductance ranges of the prior art.

SUMMARY OF THE INVENTION

A preferred programmable general purpose filter constructed according to the principles of the present invention includes an input signal sampler which provides a number of input signal samples and a reference signal sampler which provides an equal number of reference signal samples that are the weighting factors applied to the input signal samples. These weighting factors represents samples of the inpulse response of the desired filter. Each input signal sample is multiplied by a corresponding reference signal sample and the resulting signal products are summed to obtain an output signal which is the sampled output response of the filter for the given number of input signal samples.

Both the input signal sampler and the reference signal sampler may be a charge transfer device, the charge transfer efficiency of which may limit the filter characteristics that may be programmed. Limitations composed by charge transfer efficiency are aggravated by the fact that storage in these devices is unipolar and a d.c. bias must be applied to the input and reference signals at the intput terminals of the samplers. These problems are minimized with the use of a push-pull sampler or shift register which includes two tapped delay lines that operate with complementary input signals. The input signal to be sampled is coupled to the input terminal of one of the delay lines and to the input terminal of an inverter, the output terminal of which is coupled to the other delay line, thus coupling the input signal to the first delay line and the negative of the input signal to the second delay line. Simultaneously a d.c. bias voltage is coupled to the input terminals of the first and second delay lines, thus providing a bias voltage plus the signal at the input terminal of the first delay line and a bias voltage minus the signal at the input terminal of the second delay line. At each tap along the delay line, the sampled signal from the second delay line is subtracted from the sample signal of the first delay line, this results in a signal representative of the sampled signal only, thus reducing bias errors resulting from the charge transfer efficiency factor.

The subtraction required for push-pull operation for both the input and reference signal shift registers and the multiplication of the input signal sample by the reference signal sample are all accomplished by a novel circuit which employs four MOSFETS and a difference amplifier. The gate electrodes of the first and second MOSFETS are coupled as are the gate electrodes of the third and fourth. One of these pairs is coupled to a tap of one of the reference signal delay lines and the other pair is coupled to the corresponding tap of the other reference signal delay line. The drain electrodes of the first and third MOSFETS are coupled to a tap of one of the input signal delay lines and the drain electrodes of the second and fourth MOSFETS are coupled to a tap of the other input signal delay line. The drain currents of the first and fourth MOSFETS are added by connecting the source electrode of the first to the source electrode of the fourth and the drain currents of the second and third MOSFETS are added by connecting the source electrode of the second to the source electrode of the third. One of these current sums is connected to a terminal of the difference amplifier and the other current sum is connected to a second terminal of the difference amplifier. With this circuitry and with the MOSFETS operating in the triode region, the signal that appears at the output terminal of the difference amplifier is equal to the product of the sampled input signal and the sampled reference signal. Other features and advantages of the invention will become apparent from the following detailed description.

DESCRIPTION OF THE PREFERRED EMBODIMENT

The output of a filter is given by the convolution of the input signal with the impulse response of the filter. If the output signal is a sequence of sampled data, the filter output is described by the convolution equation:

$$y_i = \sum_{n=1}^{N} X_{i-n} r_n$$

wherein $Y_i$ is the filter output signal after summing the previous N samples, $X_{i-n}$ is the nth previous sample and $r_n$ is the filter impulse response value during the time interval of the nth sample. Thus a filter may be synthesized by storing the most recent N samples of the input signal $x_i$, multiplying each sample by an appropriate weighting factor which is a sample of a reference function representative of the desired filter impulse response, and summing the products.

Figure 1:
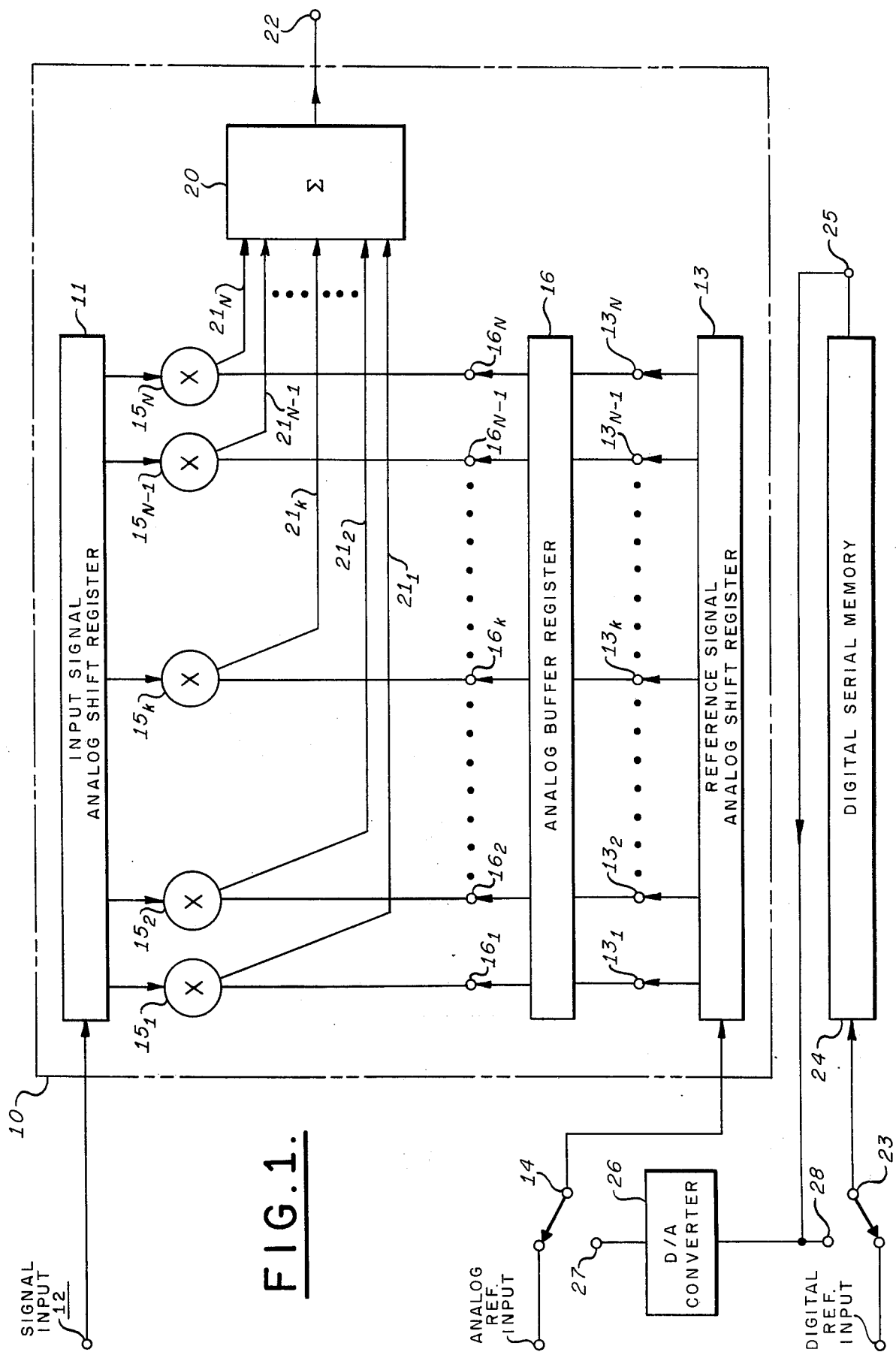
FIG. 1 is a block diagram showing a digitally programmable general purpose filter.

Referring to FIG. 1, a programmable filter 10 may include an input signal analog shift register 11, which may be a BBDL or other charge transfer device that stores the most recent samples of the input signal applied to the input terminal 12; a reference signal analog shift register 13, which stores samples of the reference signal applied to the reference signal input terminal 14; an analog buffer register 16, which may be a charge transfer device; multipliers $15_1$ to $15_N$, wherein each sample of the input signal is multiplied by a corresponding sample of the reference signal, and summation network 20. Samples of the reference function, which are the weighting factors $r_n$ for the signal samples, appear at terminals $13_1$ through $13_N$. These weighting factors may be applied directly to the multipliers $15_1$ through $15_N$ or may be stored in the analog buffer register 16, from which they are coupled to the multipliers $15_1$ through $15_N$. Weighting factors $r_n$ stored in the buffer register 16 remain stored until a new set of weights is entered therein from the analog shift register 13. Output signals from the multipliers $15_1$ to $15_N$, which represent the multiplication of the input signal samples by the weighting factors, are coupled to the summing device 20 via lines $21_1$ through $21_N$ wherein their sum representing the desired filtered signal, is obtained and coupled to an output terminal 22.

A digital reference signal may be employed to provide the weighting factor $r_n$ by coupling the digital reference signal to the input terminal 23 of a digital serial memory 24, the output terminal 25 of which couples to a digital-to-analog converter 26. The output terminal 27 of the digital-to-analog converter 26 is then coupled to the input terminal 14 of the reference signal analog shift register 13. With the incorporation of the digital serial memory 24 and the digital-to-analog converter 26, the digital reference signals are converted to analog reference signals which are coupled to the reference signal analog shift register 13, whereby the weighting factors $r_n$ are coupled to the multipliers $15_1$ to $15_N$ from the output terminals $13_1$ to $13_N$. Once a digital reference signal has been entered into the digital serial memory 24, it may be maintained by coupling the input terminal 23 of the digital serial memory 24 to the input terminal 28 of the digital-to-analog converter 26. This coupling allows the digital serial memory 24 to be periodically refreshed by recirculation while at the same time its output is converted to an analog signal which provides the analog reference to the reference signal analog shift register 13.

Storage in charge coupled and bucket brigade devices is unipolar, thus requiring a d.c. bias when an a.c. signal is to be stored. Due to the charge transfer efficiencies of these devices, bias errors are generated as the bias signal is transferred from tap to tap along the analog shift register. This problem may be minimized with the use of a push-pull analog shift register which comprises two charge transfer shift registers operating with complementary input signals. The input signal to one shift register being a bias voltage plus the signal and the input to the other being the same bias voltage minus the signal. Since the complementary relationship is maintained at each tap of the charge transfer shift register, subtracting corresponding tap signals results in an effective cancellation of the bias voltage. Thus, bias voltage error degradation to the filter response may be maintained by utilizing push-pull analog shift registers.

Figure 2:
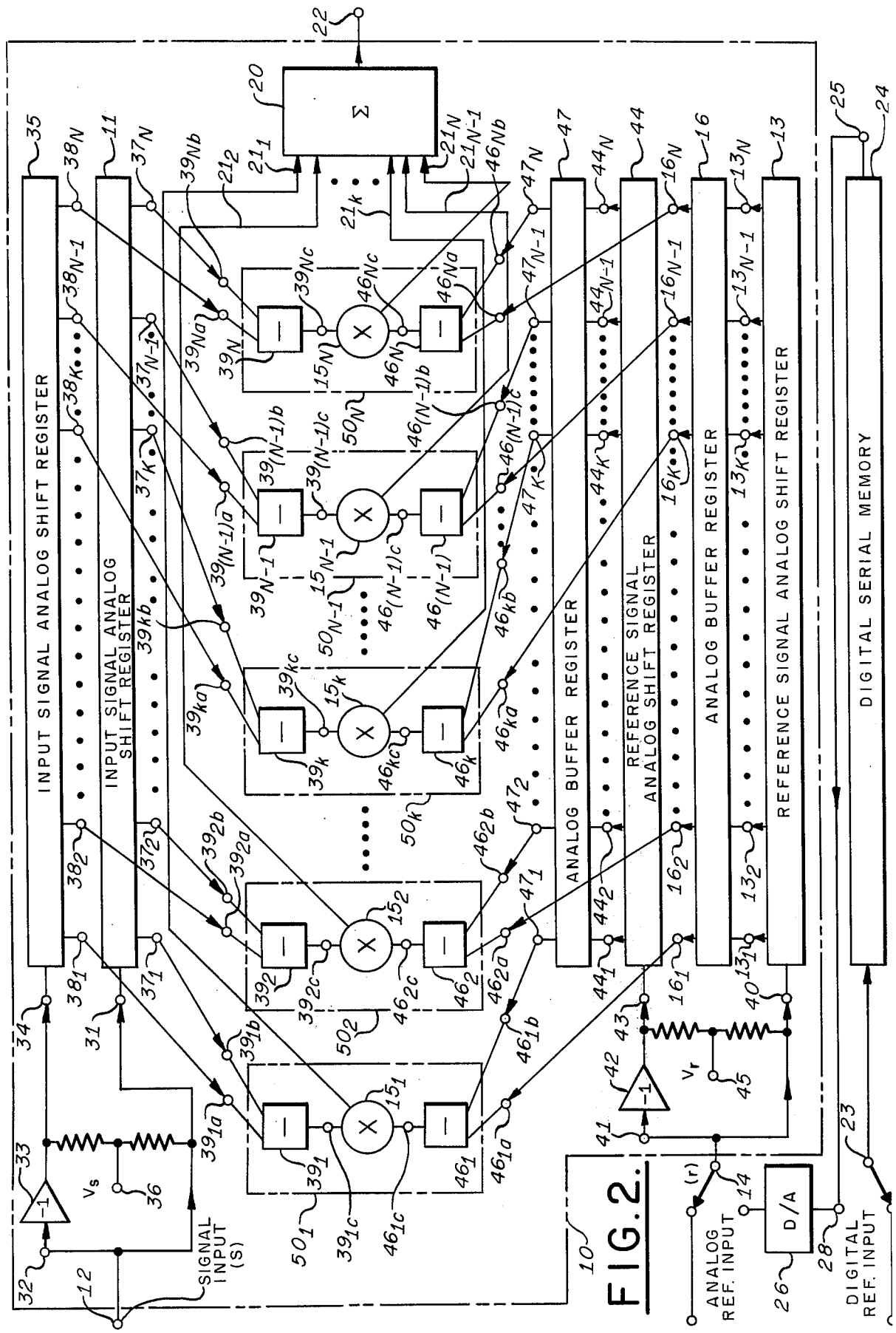
FIG. 2 is a block diagram showing a digitally programmable general purpose filter employing push-pull analog delay lines.

Refer now to FIG. 2, wherein a programmable analog filter 10 incorporating push-pull analog shift registers is shown. An input signal $s$, applied to the input terminal 12 is coupled to the input terminal 31 of the input signal analog shift register 11 and to the input terminal 32 of an inverter 33. The output signal of the inverter 33, which possesses a polarity that is opposite to the polarity of the signal applied to the input terminal 32, is coupled to the input terminal 34 of a second input signal analog shift register 35. An input signal bias voltage $V_s$ is supplied at terminal 36 by a d.c. source (not shown). The bias voltage $V_s$ is then coupled to the input terminals 31 and 34, whereby a voltage equal to $V_s+s$ is applied to the input terminal 31 of the input signal analog shift register 11 and a voltage equal to $V_s-s$ is applied to the input terminal 34 of the second input signal analog shift register 35. The output taps $37_1$ to $34_N$ of the input signal analog shift register 11 and the output taps $38_1$ to $38_N$ of the second input signal analog shift register 35, at which delayed signals $V_s+s$ and $V_s-s$ appear, are each coupled respectively to difference circuits $39_1$ to $39_N$, whereby the samples of the biased input signals $V_s+s$ and $V_s-s$, which appear at the output taps $37_1$ to $37_N$ and the output taps $38_1$ to $38_N$ are coupled to the appropriate difference circuits $39_1$ to $39_N$, wherein the difference between the sampled biased signals $V_s+s$ and $V_s-s$ is taken and a signal which is representative of the sampled input signal $s$ is coupled to each output terminal $39_{1C}$ to $39_{NC}$.

Still referring to FIG. 2, a reference signal $r$ applied to the input terminal 14, is coupled to an input terminal 40 of the reference signal analog shift register 13 and to the input terminal 41 of an inverter 42. The output signal from the inverter 42, which possesses a polarity that is opposite to the polarity of the signal applied to the input terminal 41, is coupled to the input terminal 43 of a second reference signal analog shift register 44. A reference signal bias voltage $V_r$ is supplied at terminal 45 by a d.c. source (not shown). The bias voltage $V_r$ is then coupled to the input terminals 40 and 43 of reference signal analog shift registers 13 and 44, respectively, whereby a voltage equal to $V_r+r$ is applied to the input terminal 40 of the reference signal analog shift register 13 and a voltage equal to $V_r-r$ is applied to the input terminal 43 of the second reference signal analog shift register 44. The output taps $13_1$ to $13_N$ of the reference signal analog shift register 13, at which delayed signals of $V_r+r$ appear, are coupled to corresponding input terminals of the analog buffer register 16, whereby samples of the biased reference signals $V_r+r$, at the output taps $13_1$ to $13_N$, are coupled to difference circuits $46_1$ to $46_N$ via the output terminals $16_1$ to $16_N$ of the analog buffer register 16. Similarly, the output taps $44_1$ to $44_N$ of the second reference signal analog shift register 44 are coupled to corresponding input terminals of a second analog buffer register 47, whereby samples of the biased reference signal $V_r-r$, at the output taps $44_1$ to $44_N$ are coupled to difference circuits $46_1$ to $46_N$ via the output terminals $47_1$ to $47_N$ of the analog buffer register 47. The signals at the output terminals $46_{1C}$ to $46_{NC}$ of the difference networks $46_1$ to $46_N$ are representative of the samples of the reference signal $r$, being the differences between the sampled reference signals at the output terminals $47_1$ to $47_N$ and the sampled input signals at the output terminals $16_1$ to $16_N$, respectively.

Each sample of the reference signal $r$ at the output terminals $46_{1C}$ to $46_{NC}$ of the difference networks $46_1$ to $46_N$ and each sample of the input signal $s$ at the output terminals $39_{1C}$ to $39_{NC}$ of difference networks $39_1$ to $39_N$ is coupled respectively to multipliers $15_1$ to $15_N$ wherein each sample of reference signal $r$ and the corresponding sample of input signal $s$ are multiplied. Signals at the output terminals of each of the multipliers $15_1$ to $15_N$ are coupled to summation network 20 via lines $21_1$ to $21_N$ wherein the products of the sampled reference signal $r$ and the sampled input signal $s$ are summed and a signal representative of this sum, which is the output signal of the filter, is coupled to the output terminal 22.

Though the sampled signals at the output taps of registers 13 and 44 are coupled to difference networks $46_1$ to $46_N$ via the analog buffer registers 16 and 47, these couplings could have been directly from storage registers 13 and 44 as previously discussed.

Figure 3:
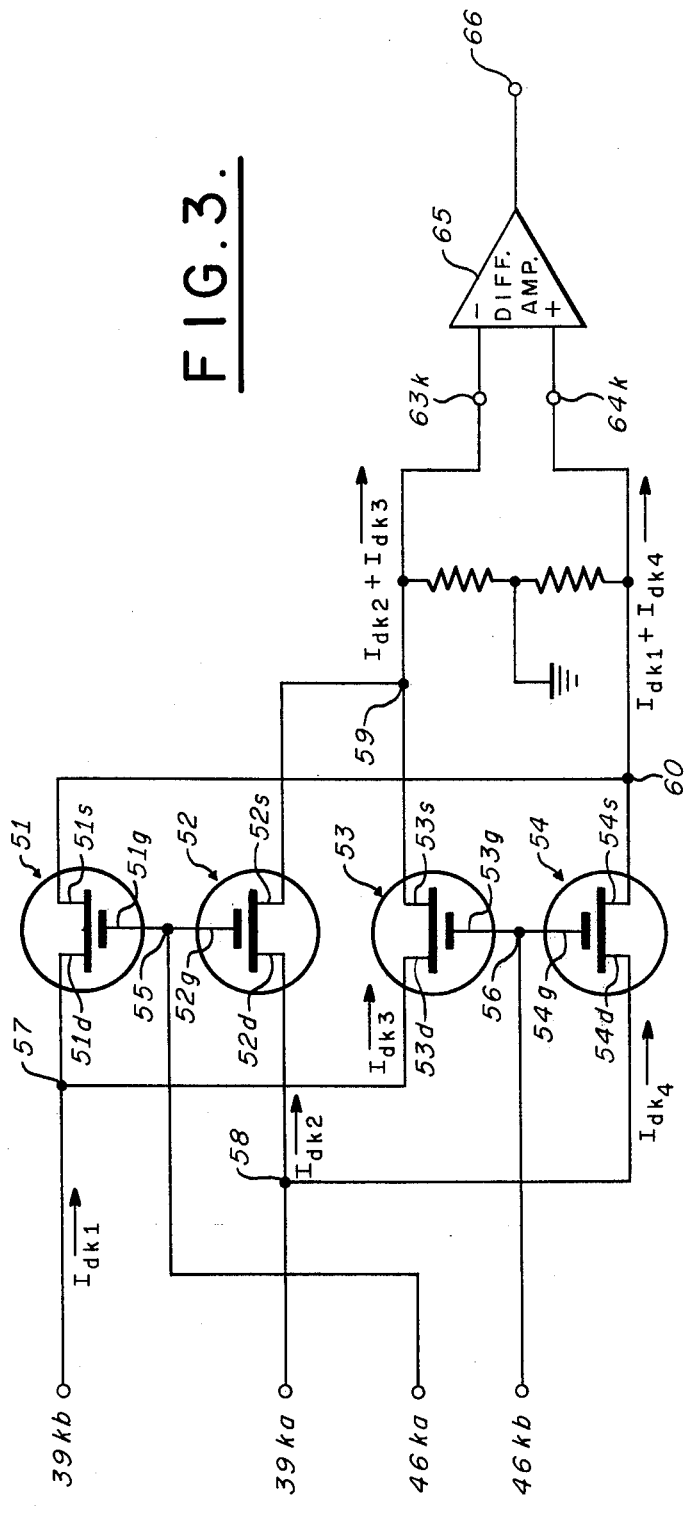
FIG. 3 is a schematic of a subtraction multiplier network.

Each of the combinations of subtraction networks $39_k$ and $46_k$ with multiplier $15_k$ comprise an over-all subtraction multiplier network $50_k$ which for simplicity hereinafter will be referred to as a multiplier. These two arithmetic operations may be performed by the network shown in FIG. 3 though other combinations of difference and multiplier circuits may be employed. FIG. 3 is a schematic diagram of a novel multiplier circuit that provides linear arithmetic operation for bipolar input signals over a large dynamic range. The circuit consists of four MOSFET transistors 51, 52, 53 and 54, all of which operate in the triode region. The gate electrode $51g$ of MOSFET 51 is connected to the gate electrode $52g$ of MOSFET 52, thereby forming a node 55 and the gate electrode $53g$ of MOSFET 53 connected to the gate electrode $54g$ of MOSFET 54 thereby forming a node 56. The drain electrode $51d$ of MOSFET 51 is connected to the drain electrode $53d$ of MOSFET 53 thereby forming a node 57 and the drain electrode $52d$ of MOSFET 52 is connected to the drain electrode $54d$ of MOSFET 54 thereby forming a node 58. The source electrodes $51s$ of MOSFET 51 and $54s$ of MOSFET 54 are connected thereby forming a node 60, and the source electrodes $52s$ of MOSFET 52 and $53s$ of MOSFET 53 are connected thereby forming a node 59. Nodes 55, 56, 57 and 58 serve as the input terminals to the multiplier $50_k$ and as such correspond to input terminals $46_{ka}$, $46_{kb}$, $39_{kb}$ and $39_{ka}$, respectively. Nodes 59 and 60 coupled to input terminals 63 and 64, respectively, of difference amplifier 65, the output terminal 66 of which couples to line $21_k$ of FIG. 1.

The voltage current relationships of a FET operating in a triode region is given by $$I_d = \beta[(V_g - V_{th}) V_d - \tfrac{1}{2} V_d^2]$$

where $I_d$ is the drain current, $V_g$ is the gate voltage, $V_d$ is the drain voltage, $V_{th}$ is the threshold voltage, and $\beta$ is a constant.

In FIG. 3, the voltage at input terminal $39_{kb}$, which is equal to $V_s+s$ is the drain voltage for FETS 51 and 53, and the voltage at input terminal $39_{ka}$, which is equal to $V_s-s$ is the drain voltage for FETS 52 and 54. The voltage at input terminal $46_{ka}$, which is equal to $V_r+r$ is the gate voltage for FETS 51 and 52 and the voltage at input terminal $46_{kb}$ is the gate voltage for FETS 53 and 54. Since the FETS are to operate in the triode region the values of $V_s$, $V_r$, $s$ and $r$ are chosen so that $V_d$ for each FET is always negative and $V_g - V_{th}$ is always more negative than $V_d$. For these conditions, the drain currents $I_{d1}$, $I_{d2}$, $I_{d3}$ and $I_{d4}$ for transistors 51, 52, 53 and 54, respectively, are $$I_{d1} = \beta[(V_r+r - V_{th})(V_s+s) - \tfrac{1}{2}(V_s+s)^2]$$
$$I_{d2} = \beta[(V_r+r - V_{th})(V_s-s) - \tfrac{1}{2}(V_s-s)^2]$$
$$I_{d3} = \beta[(V_r-r - V_{th})(V_s+s) - \tfrac{1}{2}(V_s+s)^2]$$
$$I_{d4} = \beta[(V_r-r - V_{th})(V_s-s) - \tfrac{1}{2}(V_s-s)^2]$$

The drain current $I_{d1}$ flowing through the source electrode $51s$ of transistor 51 and the drain current $I_{d4}$ flowing through the source electrode $54s$ of transistor 54 add at node 60, this sum being coupled to the positive input terminal 64 of difference amplifier 65, while the drain current $I_{d2}$ flowing through source electrode $52s$ of transistor 52 and the drain current $I_{d3}$ flowing through source electrode $53s$ of transistor 53 add at node 59 this sum being coupled to the negative input terminal 63 of difference amplifier 65, whereby the signal at the output terminal 66 of differential amplifier 65 is representative of the algebraic sum $$I_{ko} = I_{dk1} - I_{dk2} - I_{dk3} + I_{dk4} = 4\beta r_k s_k.$$

Figure 4:
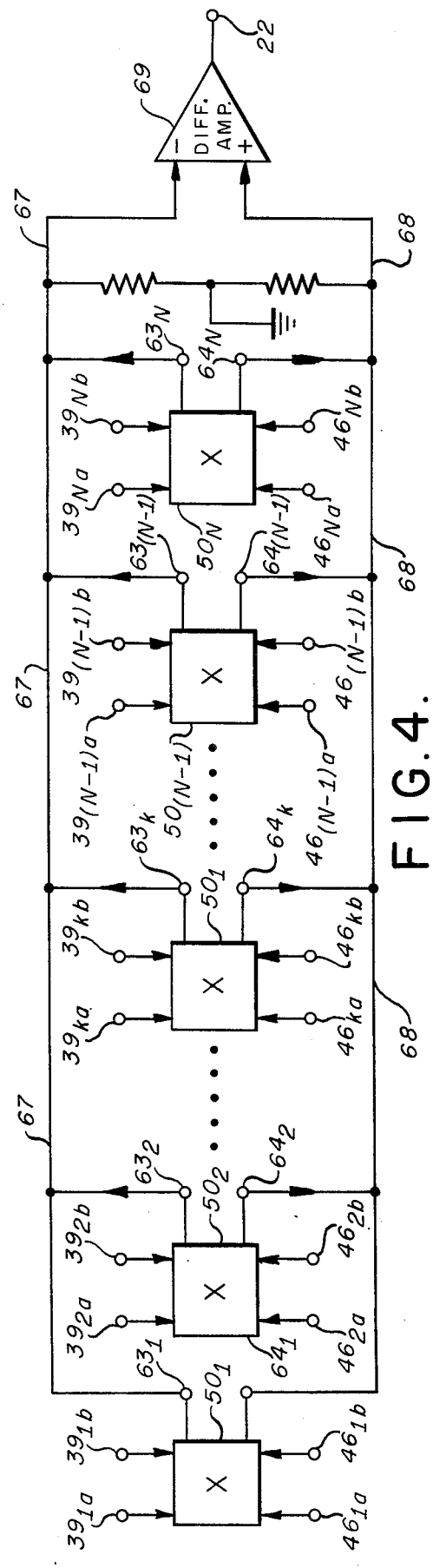
FIG. 4 is a schematic diagram, partially in block form, of a multiplier summation network.

Since each of the multipliers $50_1$ to $50_N$, when employing the circuitry of FIG. 3, provides two currents to the difference amplifier 65, the summation of the products may be accomplished by connecting all the terminals $63_1$ to $63_N$ to a common bus line 67 and all the terminals $64_1$ to $64_N$ to another bus line 68 as shown in FIG. 4. Bus lines 67 and 68 may then be coupled to the negative and positive input terminals, respectively, of difference amplifier 69. In this manner, only one amplifier need be employed to form the algebraic sum of currents, $I_{diff}$, from the contributions of all the multipliers $50_1$ to $50_N$ where:

$$I_{diff} = \sum_{k=1}^{N} I_{ko} = 4\beta \sum_{k=1}^{N} r_k s_k.$$

While the invention has been described in its preferred embodiment, it is to be understood that the words which have been used are words of description rather than limitation and that changes may be made within the purview of the appended claims without departing from the true scope and spirit of the invention in its broader aspects.

We claim:

1. A programmable general purpose filter comprising:
   input signal sampler means, having an input terminal and a plurality of output terminals, each output terminal providing a sample of an input signal applied to said input terminal;
   reference signal sampler means having an input terminal and a plurality of output terminals, the number of output terminals being equal to the number of output terminals contained in said input signal sampler, each output terminal corresponding to one of said output terminals of said input signal sampler and providing a sample of a reference signal applied to said input terminal;
   a plurality of multipliers equal in number to the number of output terminals of said input signal sampler, each multiplier being coupled to an output terminal of said input signal sampler and to said corresponding output terminal of said reference signal sampler, each of said multipliers having an output terminal at which a signal representative of the multiplication of said input signal sample by said reference signal sample is provided; and
   summation means coupled to each of said output terminals of said plurality of multipliers for providing a signal representative of the sum of the products of said input signal samples by said reference signal samples, said sum being the sampled output response to said sampled input signal of a programmed filter defined by said sampled reference signal.

2. A programmable general purpose filter is accordance with claim 1 further including:
   buffer register means having a plurality of input terminals and a plurality of output terminals, the number of input and output terminals being equal to the number of output terminals contained in said input signal sampler, each output terminal corresponding to one of said input terminals and each of said input terminals coupled to one of said output terminals of said reference signal sampler, and said corresponding output terminals coupled to said one of said multipliers corresponding to said output of said reference signal sampler, thereby storing samples of said reference signal at said one of said reference signal sampler terminals and providing said samples to said one of said multipliers.

3. A programmable general purpose filter in accordance with claim 2 further including:
   memory means for storing digital reference signals;
   converter means, coupled to said memory means and to said input terminal of said reference signal sampler, for converting digital signals to analog signals, whereby digital reference signals stored in said memory means are coupled to said reference signal sampler as analog reference signals.

4. A programmable general purpose filter in accordance with claim 1 further including:
   second input signal sampler means having an input terminal and a plurality of output terminals, each output terminal corresponding to one of said output terminals of said input signal sampler and coupled to said one of said multipliers to which said corresponding output terminal of said input signal sampler is coupled, each output terminal providing a sample of a signal applied to said input terminal;
   first inverter means, having an input terminal coupled to said input terminal of said input signal sampler means and an output terminal coupled to said input terminal of said second input signal sampler means, for providing a signal at said output terminal that is the negative of the signal applied at said input terminal, whereby the negative of said sample at one of said output terminals of said input signal sampler couples to said output terminal of said second input signal sampler corresponding thereto;
   second reference signal sampler means having an input terminal and a plurality of output terminals, each output terminal corresponding to one of said output terminals of said reference signal sampler and coupled to said one of said multipliers to which said corresponding output terminals of said reference signal sampler is coupled, each output terminal providing a sample of a signal applied to said input terminal;
   second inverter means, having an input terminal coupled to said input terminal of said reference signal sampler means and an output terminal coupled to said input terminal of said second reference signal sampler means, for providing a signal at said output terminal that is the negative of the signal applied at said input terminal, whereby the negative of said sample at one of said output terminals of said reference signal sampler couples to said output terminal of said second reference signal sampler corresponding thereto.

5. A programmable general purpose filter in accordance with claim 4 wherein each of said multipliers contains a first output terminal and a second output terminal and further including:
   first summing means coupled to each of said first output terminals of said multipliers having an output terminal for providing a signal representative of the sum of the signals at each of said first output terminals of said multipliers;
   second summing means coupled to each of said second output terminals of said multipliers having an output terminal for providing a signal representative of the sum of the signals at each of said second output terminals of said multipliers;
   means, having a first input terminal, a second input terminal and an output terminal, coupled to said output terminal of said first summing means at said first input terminal and to said second summing means at said second input terminal, for providing a signal at said output terminal that is representative of the difference of said signals at said output terminals of said first and second summing means, whereby said signal at said output terminal is representative of the sum of the products of said samples of said input signal and said samples of said reference signal.

6. A digitally programmable general purpose filter in accordance with claim 4 further including:
   memory means, having an input terminal and an output terminal, for storing digital reference signals;
   converter means, having an input terminal and an output terminal, said input terminal coupled to said output terminal of said memory means and said output terminal coupled to said input terminals of said second inverter and said reference signal sampler, for converting digital signals to analog signals, whereby digital reference signals stored in said memory are coupled to said reference signal samplers as analog reference signals.

7. A programmable general purpose filter in accordance with claim 6 further including:
first buffer register means, having a plurality of input terminals and a plurality of output terminals, each of said input terminals coupled to one of said output terminals of said reference signal sampler and each of said output terminals coupled to one of said multipliers, whereby a sample of said reference signal at said one of said reference signal sampler output terminals is coupled to said one of said multipliers;
second buffer register means, having a plurality of input terminals and a plurality of output terminals, one of said input terminals coupled to one of said output terminals of said second reference signal sampler and one of said output terminals coupled to one of said multipliers, whereby a sample of said negative of said reference signal at said one of said second reference signal sampler output terminals is coupled to said one of said multipliers.

8. A signal multiplier comprising
first electronically controlled current means, having an input terminal, an output terminal, and a control terminal;
second electronically controlled current means, having an input terminal, an output terminal, and a control terminal, said control terminal coupled to said control terminal of said first electronically controlled current means;
third electronically controlled current means, having an input terminal, an output terminal, and a control terminal, said input terminal coupled to said input terminal of said first electronically controlled current means;
fourth electronically controlled current means, having an input terminal, an output terminal, and a control terminal, said input terminal coupled to said input terminal of said second electronically controlled current means and said control terminal coupled to said control terminal of said third electronically controlled current means;
difference amplifier means, having a first input terminal, a second input terminal, and an output terminal, the operation of which provides a signal at said output terminal representative of the difference between the signals at said first and second input terminals;
said first input terminal coupled to said output terminals of said first and fourth electronically controlled current means so that the sum of the currents at said output terminals of said second and fourth electronically controlled current means is coupled to said first input terminal,
said second input terminal coupled to said output terminals of said second and third electronically controlled current means so that the sum of the currents at said output terminals of said second and fourth electronically controlled current means is coupled to said input terminal,
whereby a signal representative of the product of a first signal with a predetermined polarity and a second signal with a predetermined polarity appears at said output terminal when said first signal with said predetermined polarity is applied to said first input terminal of said first and third electronically controlled current means, said first signal with polarity opposite to said predetermined polarity appears at said input terminal of said second and fourth electronically controlled current means, said second signal with said predetermined polarity appears at said control terminals of said first and second electronically controlled current means and said second signal with polarity opposite to said predetermined polarity appears at said control terminals of said third and fourth electronically controlled current means.

9. A signal multiplier in accordance with claim 8 wherein each of said electronically controlled current means is a MOSFET.

* * * * *